US006531783B1

(12) United States Patent
Kalnitsky

(10) Patent No.: US 6,531,783 B1
(45) Date of Patent: Mar. 11, 2003

(54) METHOD OF VIA FORMATION FOR MULTILEVEL INTERCONNECT INTEGRATED CIRCUITS

(75) Inventor: Alexander Kalnitsky, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 08/436,133

(22) Filed: May 8, 1995

Related U.S. Application Data

(62) Division of application No. 08/329,767, filed on Oct. 27, 1994, now Pat. No. 5,470,793, which is a continuation of application No. 08/036,229, filed on Mar. 24, 1993, now abandoned, which is a continuation of application No. 07/726,792, filed on Jun. 28, 1991, now abandoned.

(51) Int. Cl.[7] .............................................. H01L 29/40
(52) U.S. Cl. ........................ 257/774; 257/734; 257/758; 257/759; 257/760; 257/773
(58) Field of Search ................................ 257/734, 758, 257/759, 760, 773, 774

(56) References Cited

U.S. PATENT DOCUMENTS

| 4,372,034 A | | 2/1983 | Bohr | |
|---|---|---|---|---|
| 4,466,172 A | | 8/1984 | Batra | 437/41 |
| 4,686,000 A | | 8/1987 | Heath | 437/241 |
| 4,775,550 A | | 10/1988 | Chu et al. | 437/228 |
| 4,832,789 A | | 5/1989 | Cochran et al. | |
| 5,063,176 A | | 11/1991 | Lee et al. | 437/195 |
| 5,200,808 A | * | 4/1993 | Koyama et al. | 257/760 |
| 5,319,246 A | * | 6/1994 | Nagamine et al. | 257/758 |

FOREIGN PATENT DOCUMENTS

| EP | 0200525 | 11/1986 | |
|---|---|---|---|
| JP | 1-45120 | 2/1989 | 437/981 |
| JP | 3-32026 | 2/1991 | 437/981 |

* cited by examiner

Primary Examiner—Eddie Lee
Assistant Examiner—Matthew E. Warren
(74) Attorney, Agent, or Firm—Lisa K. Jorgenson; William A. Munck

(57) ABSTRACT

A method is provided for depositing a silicon nitride layer to protect and isolate underlying layers during wet etching. The silicon nitride layer maintains the integrity of interconnect leads, bond pads, and die boundaries by acting as a wet etch stop. The silicon nitride layer stops the chemicals used in a wet etch from reaching underlying layers in the integrated circuit.

17 Claims, 3 Drawing Sheets

METHOD OF VIA FORMATION FOR MULTILEVEL INTERCONNECT INTEGRATED CIRCUITS

This is a Division, of application Ser. No. 08/329,767, filed Oct. 27, 1994, which is now U.S. Pat. No. 5,470,793 which is a continuation of application Ser. No. 08/036,229, filed Mar. 24, 1993, now abandoned, which is a continuation of application Ser. No. 07/726,792, filed Jun. 28, 1991, now abandoned.

BACKGROUND OF THE INVENTION

1. Field of the Invention

The present invention relates generally to semiconductor integrated circuits, and more specifically to a method of protecting underlying dielectric and metal layers during wet etch by depositing silicon nitride layers.

2. Description of the Prior Art

In semiconductor integrated circuits, formation of interconnect layers is important to the proper operation of these devices. Interconnect signal lines make contact to lower conductive layers of the integrated circuit through vias in an insulating layer. For best operation of the device, the lower conductive layers should not be damaged during formation of the contact via.

Various interlevel dielectric layers are deposited on the integrated circuit during formation of the device. These layers separate the conductive layers from each other. One way to form contact vias through these insulating layers is by a process which utilizes both an isotropic wet etch and an anisotropic plasma etch. A wet etch is performed by exposing the integrated circuit to liquid chemicals, such as hydrogen fluoride. After a via has been opened part way through the insulating layer, an anisotropic etch is performed to expose the underlying conductive layer.

During a wet etch, undesirable voids, defects or stressed regions in a dielectric layer allow the chemicals to travel through the dielectric layers to the underlying conductive layers. This causes some of the conductive material to be etched away, leaving spots where conductive material in a conductive layer is missing. An integrated circuit with missing conductive material is unreliable, and possibly non-functional.

An approach presently used to minimize the possibility of conductive material being etched away is to reduce the period of time allocated for wet etching. This minimizes the likelihood that the underlying conductor will be damaged. However, decreasing the wet etch time also decreases the metal step coverage improvement realized by using a partial wet etch.

The problems caused during a wet etch by chemicals etching material not intended to be removed is not limited to conductive interconnect layers. Mouse bites in die boundaries and holes in bond pads are also attributed to the attack of metal during the formation of vias by wet etching.

It would be desirable to provide a technique to incorporate a layer of material in the interlevel dielectric layers which would act as a wet etch stop during via formation.

SUMMARY OF THE INVENTION

It is therefore an object of the present invention to provide a method for forming a contact via without damaging underlying conductive layers.

It is another object of the present invention to protect underlying conductive layers from damage caused by wet etching of interlevel dielectric layers.

It is a further object of the present invention to provide such a method and structure which is compatible with standard process flows, and which adds minimal additional complexity to the fabrication of a typical integrated circuit.

Therefore, according to the present invention, a method of via formation for multilevel interconnect integrated circuits includes the depositing of a conformal layer of silicon nitride over the device before depositing the topmost layer of an interlevel oxide insulating layer. During the formation of contact vias through the combined oxide and nitride layers, a wet etch is performed. The nitride layer isolates the underlying dielectric and conductive layers from chemicals used in the wet etch, thereby maintaining the integrity of those underlying conductive and dielectric layers even if defects exist in the oxide layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
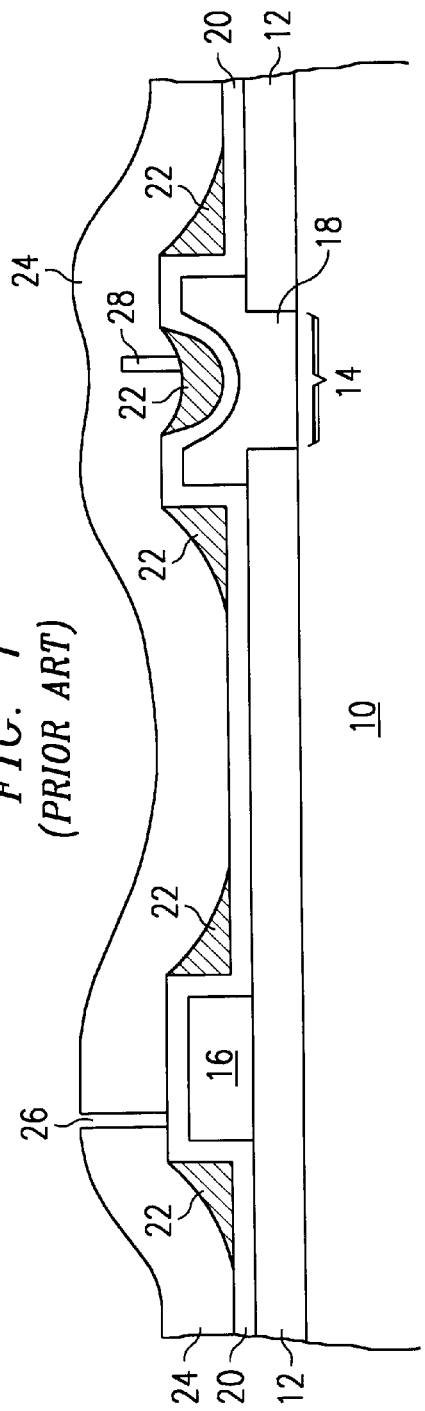
FIGS. 1 and 2 illustrate problems encountered when forming contact vias using prior art techniques.
Figure 2:
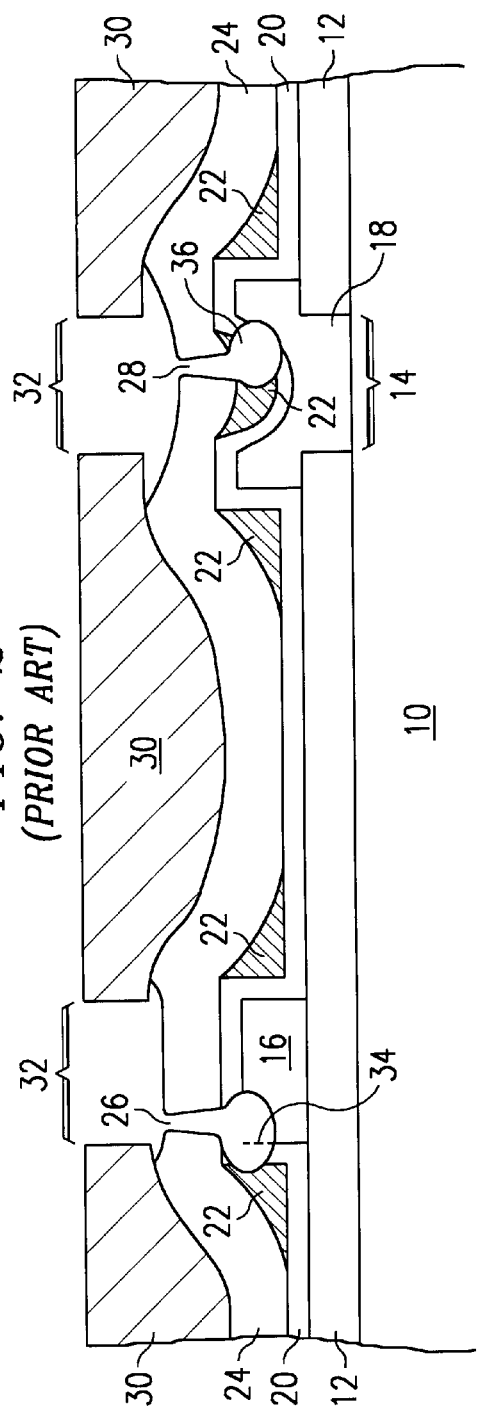

Referring to FIGS. 1 and 2, a method for forming contact vias according to prior art techniques is shown. In FIG. 1 an integrated circuit device is formed in and on an underlying region 10. Conductive region 10 represents underlying circuitry as known in the art, and the details are not relevant to the present invention. A conformal interlevel dielectric layer 12 is deposited over the surface of the integrated circuit, where a contact via 14 is formed through the dielectric layer 12 using a mask and an etching technique known in the art. A conductive layer is deposited, defined and patterned on the integrated circuit to define interconnect leads 16, 18. The interconnect leads may be metal, such as aluminum, or it may be a silicided polycrystalline silicon layer. A layer of oxide 20 is deposited over the surface of the integrated circuit, followed by a layer of spin on glass.

Once deposited over the surface of the integrated circuit, the glass is then etched back using an anisotropic etch. This results in the formation of filler regions 22 along side steep side walls or inside lower topographical areas on the integrated circuit. Another conformal dielectric layer 24, such as oxide, is then deposited over the surface of the integrated circuit This dielectric layer 24 may have voids 26, 28, in it, which are cracks or channels in the layer. A void 26 may run through the entire layer itself, or the void 28 may be located somewhere inside the layer. As will be shown, when the integrated circuit undergoes further processing, voids can create defects in the device. Stress regions on dielectric layer 24 will cause a smaller problem.

Referring to FIG. 2, a photoresist layer 30 is deposited and patterned on the integrated circuit. The photoresist layer 30 is used as a mask while the integrated circuit undergoes a wet etch. The wet etching technique is performed by exposing the integrated circuit to liquid chemicals, such as hydrogen fluoride, which selectively remove material from the device. The wet etch is used to create an opening 32 part way through the oxide layer 24. If the oxide layer 24 has voids 26, 28 in it, the chemicals used in the wet etch will etch through materials not intended to be removed and create defects 34, 36 in the integrated circuit.

Figure 3:
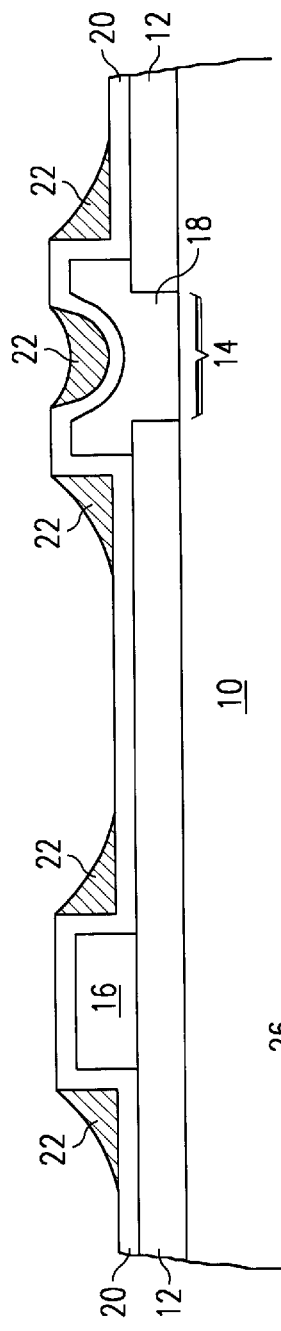
FIGS. 3–7 illustrate a preferred method of via formation for use with integrated circuits.

FIG. 3 illustrates a preferred technique according to the present invention which is used to create integrated circuits, as described above in reference to FIG. 1. This technique produces the underlying conductive region 10, an interlevel dielectric layer 12, a contact via 14, interconnect leads 16, 18, an oxide layer 20, and filler regions of glass 22 as described above.

Figure 4:
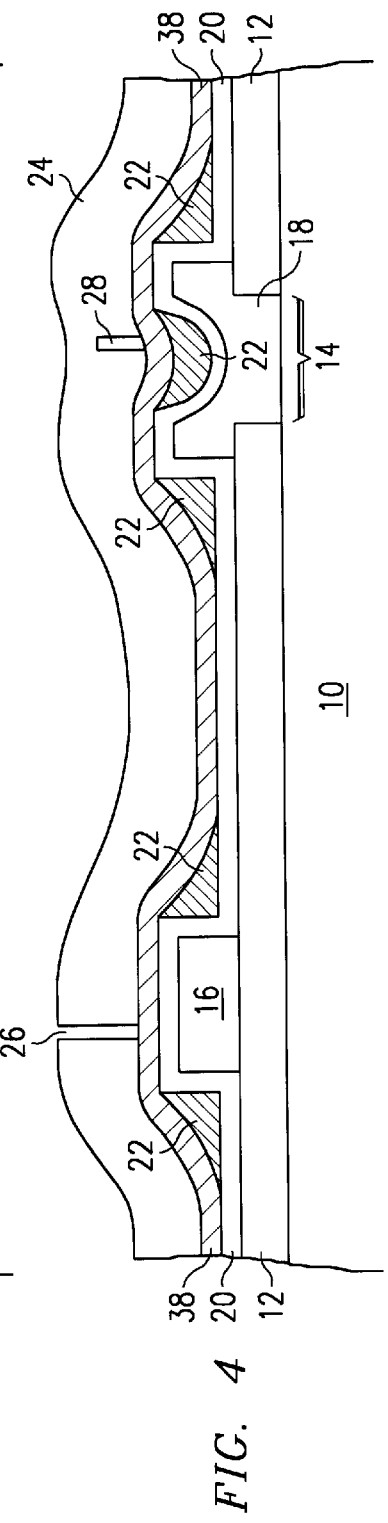

Referring to FIG. 4, a conformal layer of silicon nitride 38 is deposited over the surface of the integrated circuit. The silicon nitride layer 38 may be 100 to 2,000 angstroms thick. A conformal layer of dielectric 24 is then deposited over the surface of the device. Layer 24 is preferably an undoped CVD oxide layer. As shown in FIG. 4, the dielectric layer 24 contains voids 26, 28.

Figure 5:
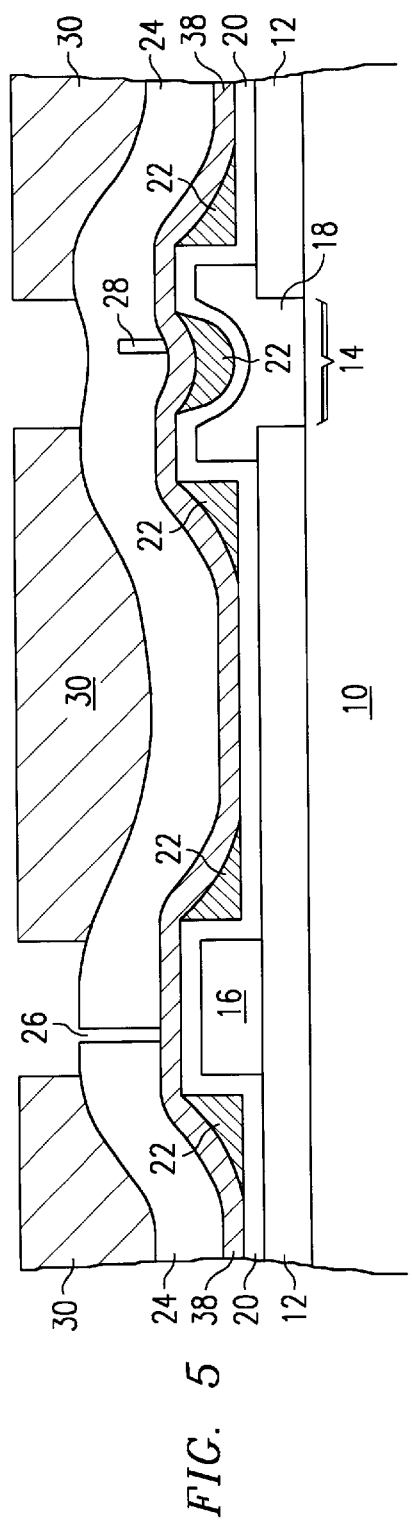

FIG. 5 illustrates the integrated circuit with a photoresist layer 30 deposited over the surface of the integrated circuit. The photoresist layer 30 is patterned and defined using methods known in the art.

Figure 6:
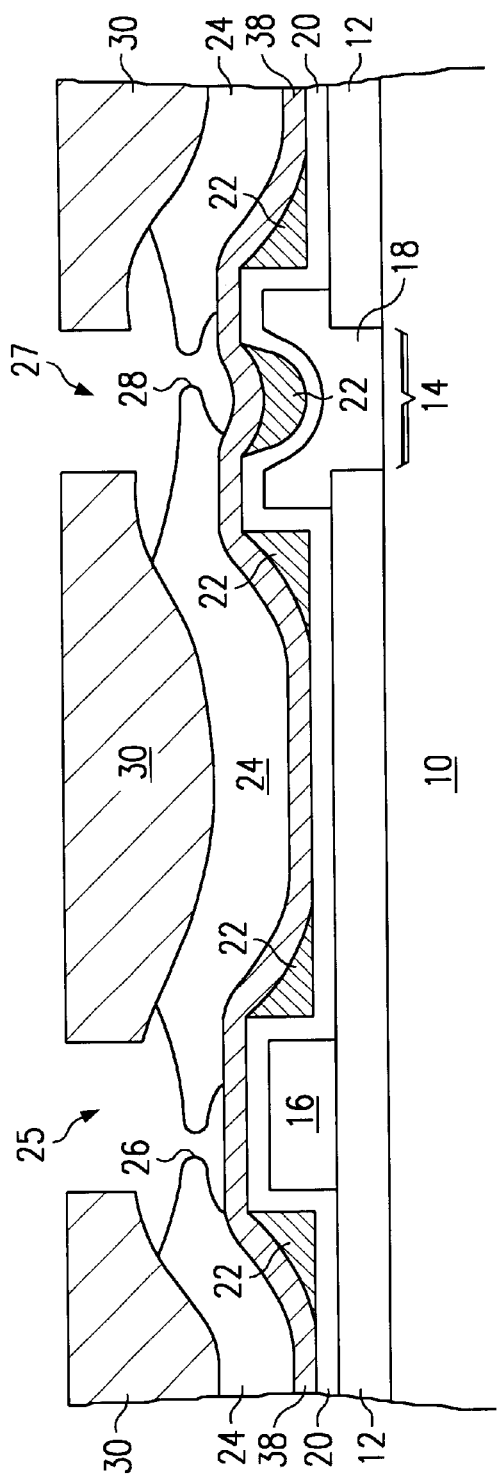

FIG. 6 illustrates the integrated circuit after a wet etch is performed part way through the dielectric layer 24. During the wet etch, chemicals will etch through the voids 26, 28 in the dielectric layer 24 and be stopped by the barrier of silicon nitride layer 38. The underlying layers of dielectric 20, glass 22, and interconnect leads 16, 18 are protected from accidental etching caused by the chemicals traveling through the voids 26, 28.

Figure 7:
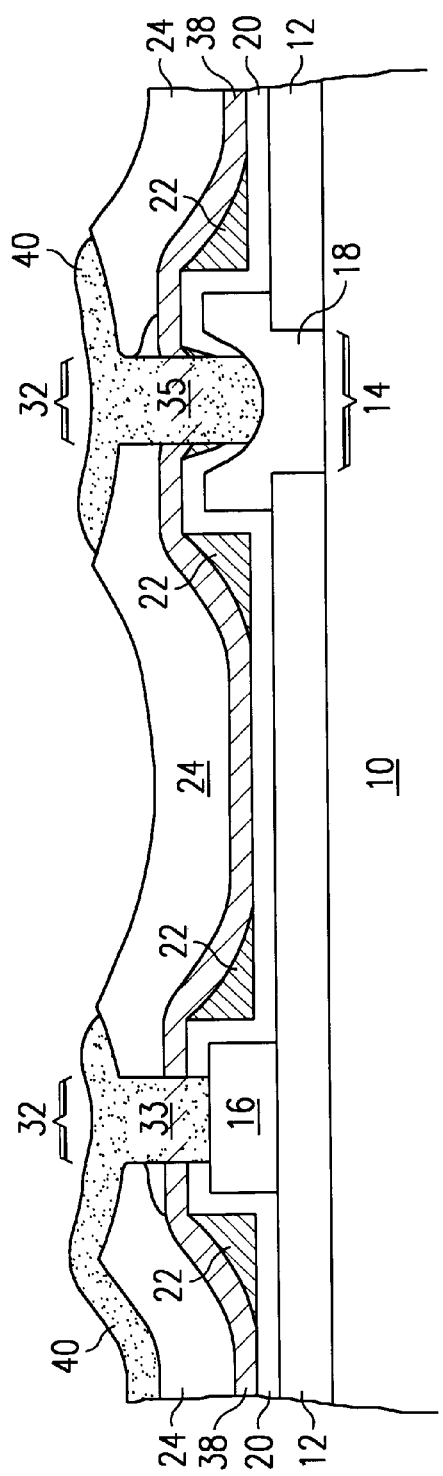

Referring to FIG. 7 an anisotropic etch is performed using photoresist 30 as a mask. This completes formation of the opening 32 to expose a portion of the interconnect leads 16, 18. FIG. 7 illustrates the integrated circuit with the photoresist layer 30 removed. Conductive material 40 is then deposited and patterned on the device making electrical contact with interconnect leads 16, 18.

As will be appreciated by those skilled in the art, the method described above provides for isolation of the insulating layers and interconnect leads 16, 18 during wet etching. Depositing a layer of silicon nitride 38 adds a minimal amount of complexity to the process flow, and is compatible with standard process flows currently in use. This technique allows for improved via formation in multilevel interconnect integrated circuits. This technique also can be used to make electrical contact to active regions within a substrate.

The period of time allocated for a wet etch can be varied to suit process requirements. For example, a thick silicon nitride layer and a thin overlying oxide layer may be deposited on an integrated circuit. A wet etch can be used to etch completely through the oxide layer, followed by an anisotropic etch to etch through the silicon nitride layer. Alternatively, a wet etch can be used to etch only part way through the oxide layer, with the anisotropic etch performed on the remaining oxide layer, silicon nitride layer, and any underlying layers in order to complete via formation.

While the invention has been particularly shown and described with reference to a preferred embodiment, it will be understood by those skilled in the art that various changes in form and detail may be made therein without departing from the spirit and scope of the invention.

What is claimed is:

1. A contact structure on a semiconductor integrated circuit, comprising:
   a conductive element;
   a first dielectric layer overlying said conductive element;
   a second dielectric layer overlying said first dielectric layer;
   a third dielectric layer overlying said second dielectric layer, said third dielectric layer containing voids which allow a chemical wet etch to pass through said third dielectric layer to said second dielectric layer, wherein said second dielectric layer is made of material having a slower etching speed than said third dielectric layer;
   an opening through said first, second and third dielectric layers to expose a portion of said conductive element; said opening having an upper portion and a lower portion wherein the upper portion of said opening is the result of a chemical wet etch;
   a second conductive element overlying portions of said third dielectric layer and extending into said opening; wherein said second conductive element makes electrical contact with said first conductive element.

2. The contact structure of claim 1, wherein said conductive element is an interconnect.

3. The contact structure of claim 1, wherein said second dielectric layer is silicon nitride and said third dielectric layer is oxide.

4. The contact structure of claim 1, wherein said lower portion of said opening is the result of an anisotropic etch.

5. The contact structure of claim 1, wherein filler regions are placed along vertical sidewalls and in lower topographical areas on the integrated circuit.

6. The contact structure of claim 5, wherein said filler regions comprises spin on glass.

7. A contact structure on a semiconductor integrated circuit, comprising:
   a conductive region;
   a first dielectric layer overlying said conductive region;
   an opening through said dielectric layer to expose a portion of said conductive region;
   a first conductive layer overlying portions of said first dielectric layer and extending into said opening; wherein said first conductive layer makes electrical contact with said conductive region;
   a second dielectric layer overlying said first conductive layer and said first dielectric layer, said second dielectric layer having an upper surface and a lower surface;
   a third dielectric layer overlying portions of said second dielectric layer, said third dielectric layer having an upper surface and a lower surface;
   a fourth dielectric layer overlying said second and third dielectric layers;
   a fifth dielectric layer overlying said fourth dielectric layer, said fifth dielectric layer containing voids which allow a chemical wet etch to dass through said fifth dielectric layer to said fourth dielectric layer,;
   a second opening through said fifth, fourth, third and second dielectric layers to expose a portion of said first conductive layer; said second opening having an upper portion and a lower portion, and
   a second conductive layer overlying portions of said fifth dielectric layer and extending into said second opening;

wherein said second conductive layer makes electrical contact with said first conductive layer.

8. The contact structure of claim 7, wherein said third dielectric layer comprises a spin on glass.

9. The contact structure of claim 8, wherein said upper surface of said third dielectric layer is more planar than said upper surface of said second dielectric layer.

10. The contact structure of claim 7, wherein said second and fifth dielectric layers comprise substantially undoped silicon oxide.

11. The contact structure of claim 7, wherein said first and second conductive layers comprise a conductive metal.

12. The contact structure of claim 7, wherein said first and second conductive layers comprise silicided polycrystalline silicon.

13. The contact structure of claim 7, wherein said fourth dielectric layer comprises silicon nitride.

14. The contact structure of claim 7, wherein said second, fourth and fifth dielectric layers are conformal with their respective underlying structure.

15. The contact structure of claim 7, wherein said upper portion of said second opening is the result of a wet etch.

16. The contact structure of claim 15, wherein said lower portion of said second opening is the result of an anisotropic etch.

17. The contact structure of claim 16, wherein during an anisotropic etch the second dielectric layer is etched away at the same time and along with said third dielectric layer.

* * * * *